(12) United States Patent
Kamei

(10) Patent No.: US 7,467,901 B2
(45) Date of Patent: Dec. 23, 2008

(54) SUBSTRATE HEAT TREATMENT APPARATUS

(75) Inventor: Kenji Kamei, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 267 days.

(21) Appl. No.: 11/489,339

(22) Filed: Jul. 19, 2006

(65) Prior Publication Data

US 2007/0017386 A1    Jan. 25, 2007

(30) Foreign Application Priority Data

Jul. 21, 2005    (JP)    ............................. 2005-211109

(51) Int. Cl.
*G03D 5/00*    (2006.01)
*G03F 7/00*    (2006.01)
*H05B 3/68*    (2006.01)

(52) U.S. Cl. ...................... 396/611; 396/571; 430/311; 219/444.1

(58) Field of Classification Search ................. 396/571, 396/611; 430/30, 311; 219/444.1
See application file for complete search history.

(56) References Cited

FOREIGN PATENT DOCUMENTS

| JP | 9-8049 | 1/1997 |
|----|--------|--------|
| JP | 10-189429 | 7/1998 |
| JP | 2000-3843 | 1/2000 |

*Primary Examiner*—Alan A Mathews
(74) *Attorney, Agent, or Firm*—Ostrolenk, Faber, Gerb & Soffen, LLP

(57) ABSTRACT

A substrate heat treatment apparatus for heat-treating a substrate includes a bake plate for supporting the substrate, and a cover disposed above the bake plate and temperature-controlled for securing a heat-treating atmosphere of the bake plate. An adjusting device adjusts a space between the cover and the bake plate. A control device adjusts the space, through the adjusting device, successively to a transport space for allowing transport of the substrate, a transitional space smaller than the transport space and close to the bake plate, and a steady space smaller than the transport space and larger than the transitional space.

11 Claims, 5 Drawing Sheets

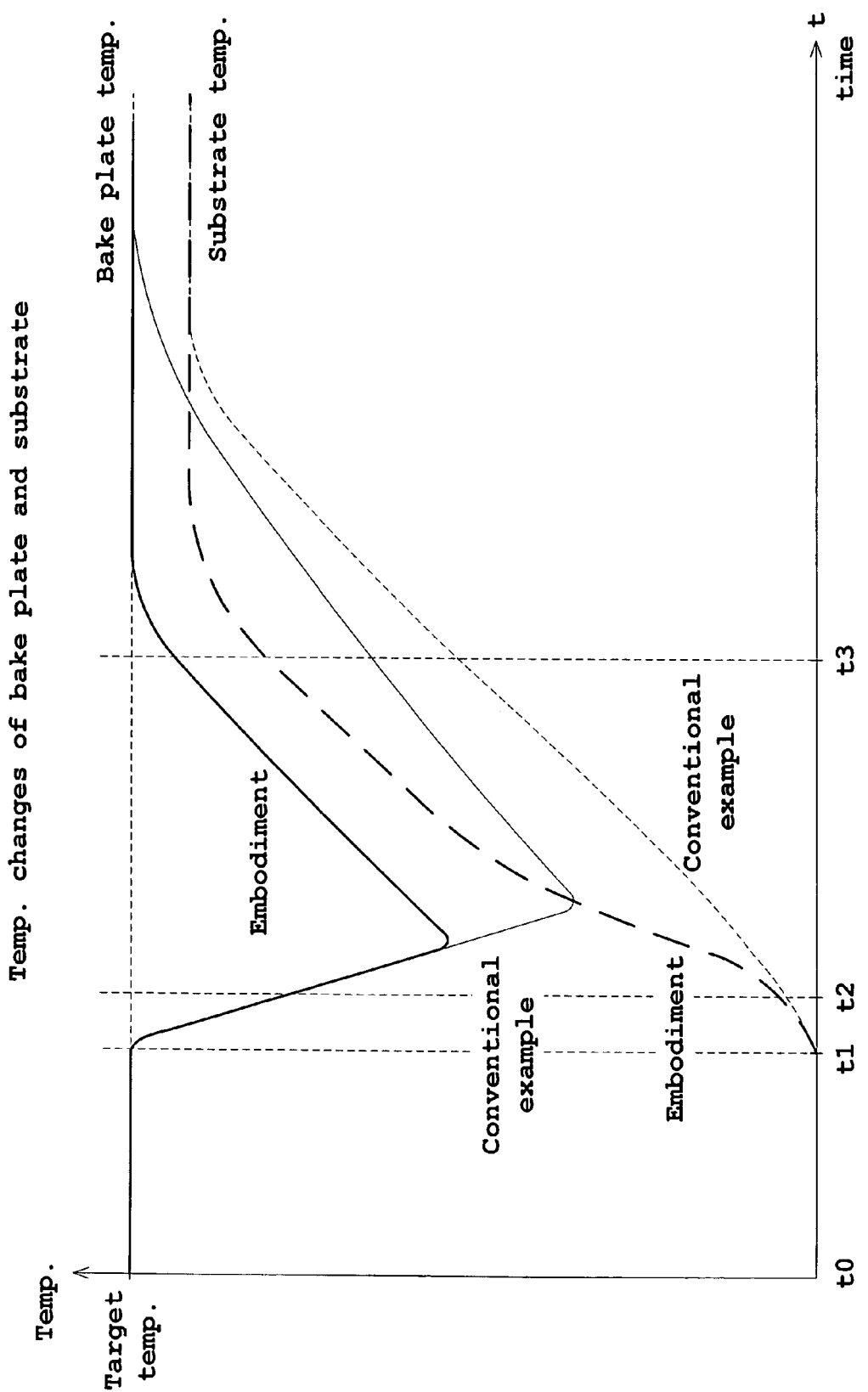

SUBSTRATE HEAT TREATMENT APPARATUS

BACKGROUND OF THE INVENTION (1) Field of the Invention

This invention relates to a substrate heat treatment apparatus for heat-treating substrates such as semiconductor wafers and glass substrates for liquid crystal displays (hereinafter simply called substrates).

(2) Description of the Related Art

A conventional substrate heat treatment apparatus of the type noted above has a bake plate for supporting a substrate, and a cover for securing a heat-treating atmosphere above the bake plate. The cover has a heater. By controlling the temperature of the cover, a target temperature is attained in a short time even when a preset temperature is changed (as disclosed in Japanese Unexamined Patent Publications Nos. 1997-8049 and 1998-189429, for example).

A different apparatus has a construction for adjusting varied locations on a surface of a substrate placed on a bake plate relative to a cover, to adjust a temperature distribution over the surface of the substrate (as disclosed in Japanese Unexamined Patent Publication No. 2000-3843, for example).

These conventional apparatus have the following drawbacks.

With an increasingly refined pattern rule in the semiconductor manufacturing process in recent years, it has been desired to expedite throughput by raising a rate of temperature increase to a target temperature for heat treatment after feeding a substrate into an apparatus. Not only this, but it is also required to minimize the time taken in a temperature increasing process leading to the target temperature when a temperature distribution tends to be unstable, and to improve a transitional temperature distribution over the surface of the substrate. For this purpose, it is necessary to control the temperature of the cover, and to set the cover close to the bake plate. However, the cover and bake plate are subjected to separate temperature controls, and mutual heat interference would render the temperature controls difficult. The strong heating action of the bake plate can cause the temperature in the cover to overshoot the target temperature.

SUMMARY OF THE INVENTION

This invention has been made having regard to the state of the art noted above, and its object is to provide a substrate heat treatment apparatus capable of stabilizing temperature control near a target temperature by adjusting a distance of a cover during a temperature control process, while reducing the time taken in a temperature increasing process.

A substrate heat treatment apparatus for heat-treating a substrate, according to this invention, comprises a bake plate for supporting the substrate; a cover disposed above the bake plate and temperature-controlled for securing a heat-treating atmosphere of the bake plate; an adjusting device for adjusting a space between the cover and the bake plate; and a control device for adjusting the space, through the adjusting device, successively to a transport space for allowing transport of the substrate, a transitional space smaller than the transport space and close to the bake plate, and a steady space smaller than the transport space and larger than the transitional space.

According to this invention, the control device causes the adjusting device to adjust the space between the cover and bake plate to the transport space, transitional space and steady space in the stated order. That is, the transport space is set for loading the substrate, and the transitional space is set for a temperature increasing process to increase temperature at a rapid rate. Subsequently, the steady space is set, thereby preventing an interaction between temperature controls of the cover and bake plate. As a result, the temperature increasing process is reduced in time, and temperature control is stabilized near a target temperature.

In this invention, the adjusting device may provide, as the transitional space, a space between a lower surface of the cover and an upper surface of the substrate preset to be 0.5 to 4 mm.

It is desirable to set a minimal space of 0.5 mm when treating a substrate free from curvature, and to set a somewhat large space of about 4 mm to accommodate a curvature when treating a curved substrate.

The adjusting device may provide, as the steady space, a space between the lower surface of the cover and the upper surface of the substrate preset to be 5 to 20 mm.

A space of 5 to 20 mm can prevent heat interference between the bake plate and cover.

The control device may be arranged to make adjustments successively to the transitional space and to the steady space after a start of heat treatment according to time intervals based on a predetermined treating procedure.

The adjustment is made to each space according to time intervals based on the predetermined treating procedure by automatically clocking time with a timer, for example. This realizes a simplified construction.

Alternatively, the control device may be arranged to make an adjustment to the transitional space when a large difference exists between a target temperature and a current temperature after a start of heat treatment, and make an adjustment to the steady space when the difference is reduced to a predetermined value.

Since an adjustment is made to each space according to a difference between a target value and a current value of temperature, a proper adjustment can be made to each space according to circumstances.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 5 is a graph showing the temperature changes of a bake plate and a substrate.

DESCRIPTION OF THE PREFERRED EMBODIMENTS

An embodiment of this invention will be described hereinafter with reference to the drawings.

Figure 1:
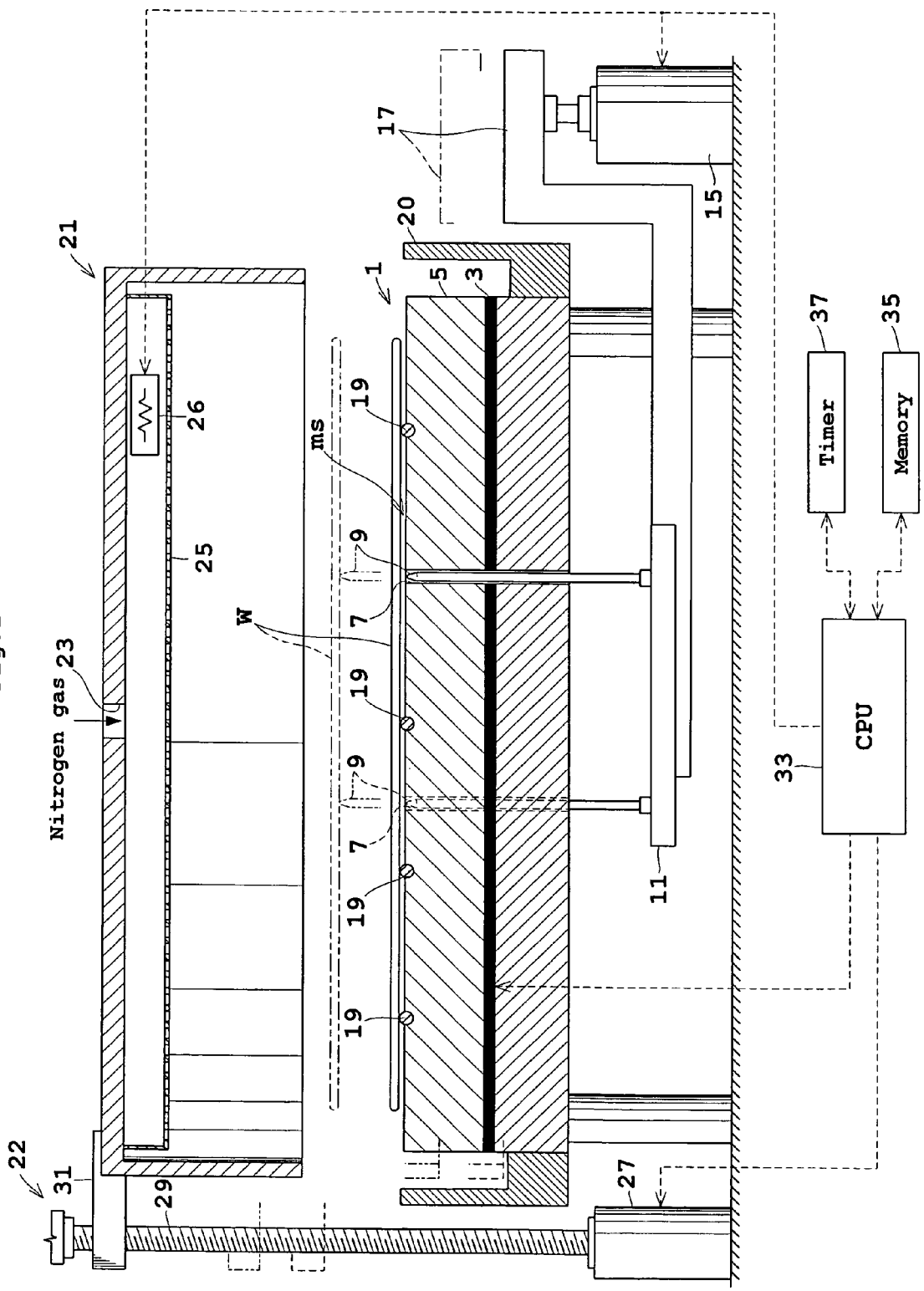
FIG. 1 is a view showing an outline of a substrate heat treatment apparatus according to this invention.

FIG. 1 is a view showing an outline of a substrate heat treatment apparatus according to this invention.

A bake plate 1 for supporting a substrate or wafer W on an upper surface thereof has a heating element 3 such as a mica heater mounted in a lower portion thereof. A heat transfer portion 5 between the heating element 3 and the upper surface of bake plate 1 has a plurality of heat pipes, not shown, embedded therein. Cooling grooves, not shown, are formed between the heat pipes for circulating a cooling fluid.

Instead of the heat transfer portion 5 having a plurality of heat pipes embedded therein, the heat transfer portion 5 itself may have a heat pipe structure.

The bake plate 1 has three perforations 7 extending from the upper surface to the lower surface. These perforations 7 are formed in positions corresponding to the apexes of an equilateral triangle in plan view, each having a support pin 9 inserted therein. Each support pin 9 has a lower end disposed on a support member 11. The support member 11 is attached to a lift arm 17 connected to a working rod of an air cylinder 15. Thus, when the air cylinder 15 is operated, the lift arm 17 is raised to cause each support pin 9 to project upward from the upper surface of bake plate 1 (as indicated by two-dot chain lines in FIG. 1). When the air cylinder 15 is made inoperative, the working rod is retracted to lower the lift arm 17. Then, each support pin 9 is withdrawn down from the upper surface of bake plate 1 (as indicated by solid lines and dotted lines in FIG. 1). This operation allows a wafer W to be transferred to and from a transport device not shown.

The upper surface of bake plate 1 has seven recesses formed, clear of the perforations 7, in the central position, in positions corresponding to the apexes of an equilateral triangle, and in positions on extensions from the central position through the positions corresponding to the apexes. Balls 19 of slightly larger diameter than the depth of the recesses are fitted in the recesses. Further, three recesses are formed similarly in positions on extensions from the central position through the perforations 7, and balls 19 are fitted in these recesses. When a wafer W is placed on the bake plate 1, these ten balls 19 support the wafer W, forming a minute space "ms" called a proximity gap from the upper surface of bake plate 1. Thus, the wafer W can be heated uniformly by radiant heat from the upper surface of bake plate 1. The number and positions of balls 19 may be set appropriately according to the diameter of wafer W, for example.

The bake plate 1 has a recess 20 formed circumferentially of a lower portion thereof. The recess 20 accommodates a lower portion of a cover 21 described hereinafter and, in combination with the cover 21, secures a heat-treating atmosphere of the bake plate 1.

The cover 21 defining a chamber of this apparatus is disposed above the bake plate 1. This chamber cover 21 is movable by a lift mechanism 22 in three stages between a "transport position" shown in solid lines in FIG. 1, a "transitional position" shown in dotted lines in FIG. 1, and a "steady position" shown in two-dot chain lines in FIG. 1.

The cover 21 has a nitrogen gas supply bore 23 formed in an upper position thereof, and a punching board 25 attached to enclose an area adjacent a lower surface. The punching board 25 is provided for uniforming currents of nitrogen gas supplied from the supply bore 23. The cover 21 contains a heater 26 for controlling temperature of the nitrogen gas and the cover 21 itself. The "transport position" noted above is a position for transferring the wafer W to and from the transport device not shown. This position is set to provide a "transport space" between the upper surface of the wafer W placed on the bake plate 1 and the lower surface of the punching board 25. The "transitional position" is where the temperature of the bake plate 1 rises rapidly to a target temperature after having lowered as a result of the cover 21 being raised for allowing transport of the wafer W. This position is set to provide a "transitional space" smaller than the above "transport space", in which the lower surface of the punching board 25 of the cover 21 lies close to the upper surface of the wafer W placed on the bake plate 1. The "steady position" is a position where the temperature is stabilized, and is set to provide a space smaller than the "transport space" and larger than the "transitional space".

Preferably, the "transitional space" is set by taking into account the size of the wafer W and a maximum amount of curvature of the wafer W, and its preferred range is 0.5 to 4 mm, for example. As for the "steady space", it is preferred to consider heat interference between the bake plate 1 and cover 21, which is in a range of 5 to 20 mm.

The lift mechanism 22 is constructed as follows.

A motor 27 has a vertical rotary shaft interlocked to a screw shaft 29. The screw shaft 29 is meshed with a mounting bracket 31 attached to an upper periphery of the cover 21. Thus, when the motor 27 is driven, the mounting bracket 31 moves up and down along the screw shaft 29 to move the cover 21 to each of the positions described above.

A CPU 33 has, connected thereto, a memory 35 that stores a predetermined treatment procedure (hereinafter called the recipe), and a timer 37 for clocking time intervals for controlling the varied components according to the recipe. The CPU 33 controls the temperature of the heating element 3, extension and contraction of the air cylinder 15, rotation of the motor 27 and temperature of the heater 26, while executing the recipe, according to the clocking of the timer 37.

Figure 2:
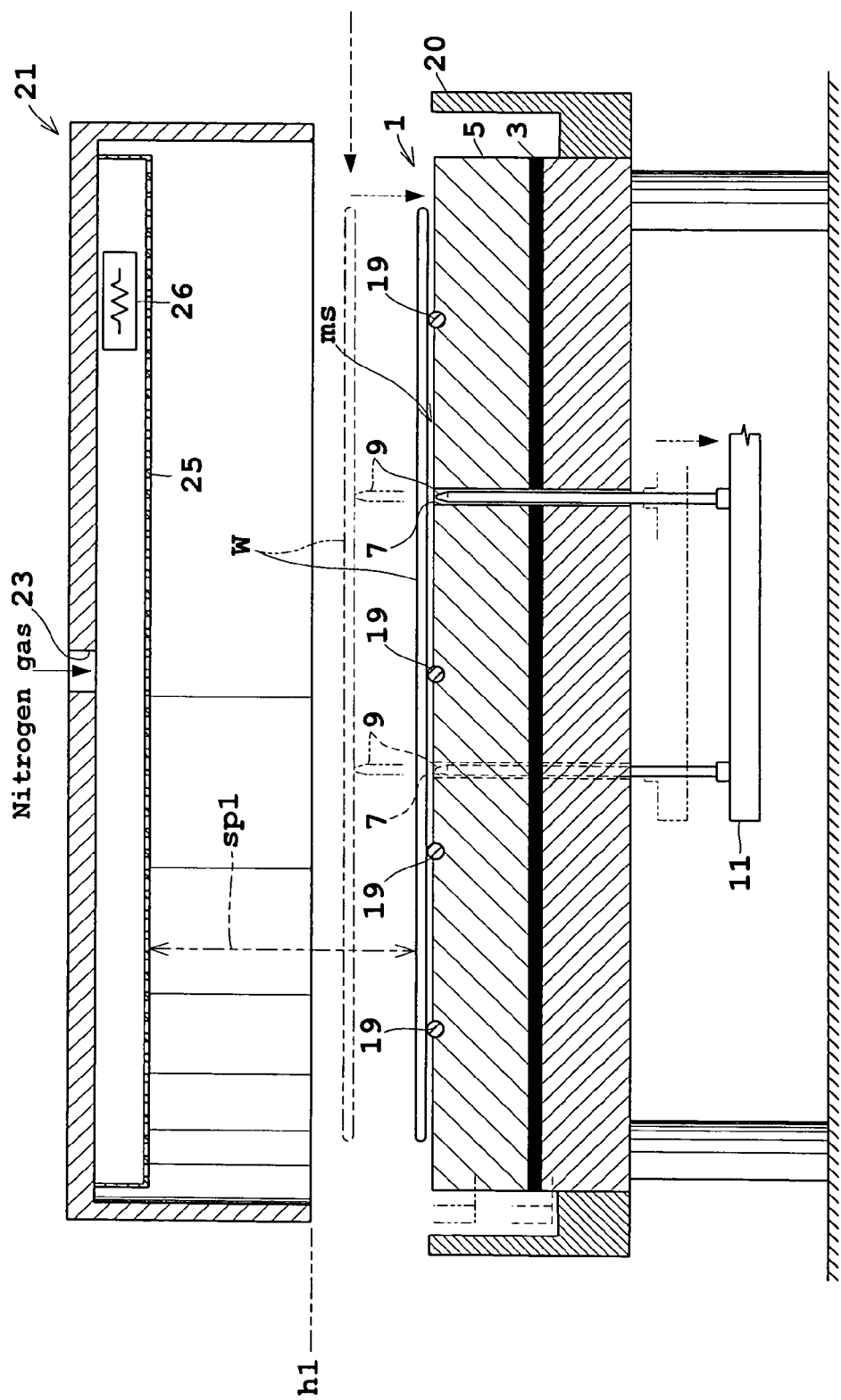
FIG. 2 is an explanatory view of operation.
Figure 3:
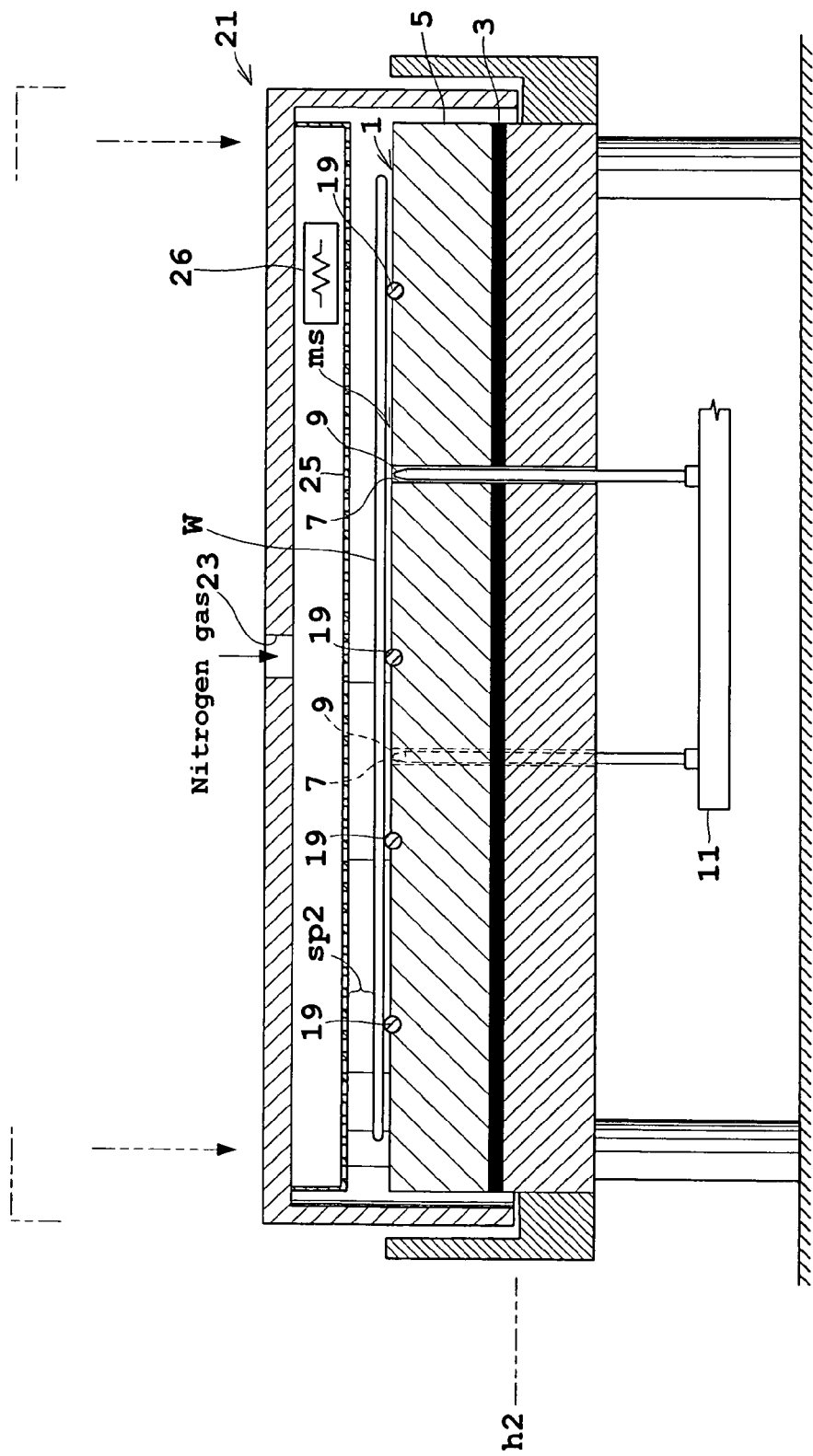
FIG. 3 is an explanatory view of operation.
Figure 4:
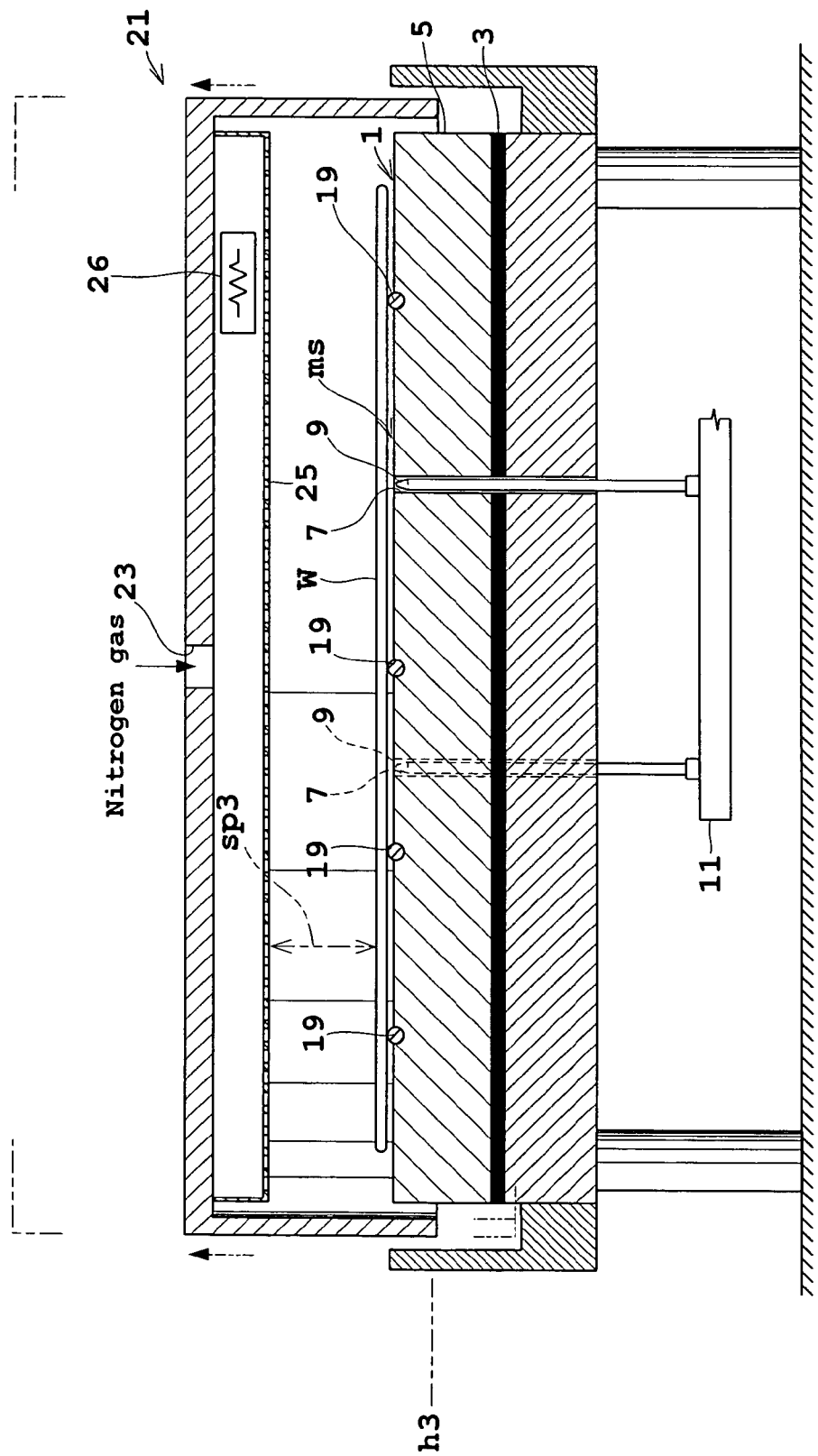
FIG. 4 is an explanatory view of operation.

Next, operation of the substrate heat treatment apparatus having the above construction will be described with reference to FIGS. 2 through 4. FIGS. 2 through 4 are explanatory views of operation.

The CPU 33 controls the motor 27 to move the cover 21 to "transport position" h1, and extends the air cylinder 15 to project the support pins 9 from the upper surface of the bake plate 1 (as indicated by two-dot chain lines in FIG. 2). The transport device not shown transports a wafer W into the "transport space" sp1 and places the wafer on the support pins 9. After the transport device leaves, the CPU 33 contracts the air cylinder 15 to retreat the support pins 9 into the bake plate 1. Then, the lower surface of the wafer W contacts, to be supported by, the balls 19, forming the minute space "ms" from the upper surface of bake plate 1.

The CPU 33 starts the timer 37 at the time the air cylinder 15 is contracted, and controls the motor 27 to move the cover 21 to the "transitional position" h2 after lapse of a predetermined time (e.g. a very short time until the wafer W is placed correctly) (FIG. 3). As a result, the "transitional space" sp2 is provided in which the punching board 25 lies adjacent the upper surface of the wafer W. Further, the CPU 33 actuates the timer 37 to clock predetermined times.

After lapse of a predetermined time from the time of setting the "transitional space" sp2, the CPU 33 controls the motor 27 to move the cover 21 to the "steady position" h3 (FIG. 4). As a result, the interval between the upper surface of the wafer W and the lower surface of the punching board 25 of the cover 21 is set to a "steady space" sp3 larger than the "transitional space" sp2. With this space provided, heat interference hardly occurs between the heating element 3 and heater 26, but the temperature control of each is performed with high accuracy. Also with the "transitional space" sp2, the lower part of the cover 21 lies in the recess 20, whereby the heat-treating atmosphere is maintained clean. This state is maintained for a predetermined time according to the recipe, based on the clocking of the timer 37. Upon lapse of the predetermined time, the CPU 33 drives the motor 27 to raise the cover 21 to the "transport position" h1, and extends the air cylinder 17 to move the wafer W away from the upper surface of bake plate 1. Then, the wafer W is transported out through the "transport space" sp1.

Through the above series of processing steps, heat treatment of the wafer W is carried out according to the recipe. A comparison between this embodiment and a conventional example with regard to temperature changes occurring during the above treatment will be described with reference to FIG. 5. FIG. 5 is a graph showing the temperature changes of the bake plate and substrate.

In this embodiment, as illustrated in the graph of FIG. 5, the wafer W is placed on the bake plate 1 at a point of time t1, forming the minute space "ms", with the "transport space" sp1 set as described above, the "transitional space" sp2 is set at a point of time t2 time, and the "steady space" sp3 is set at a point of time t3. In the conventional example, the wafer W is placed on the bake plate with a space corresponding to the transport space in this invention set at the point of time t1, thereafter a space corresponding to the transitional space in this invention is set at the point of time t2, and this space corresponding to the transitional space in this invention is maintained until completion of heat treatment of the wafer W. For both the embodiment and conventional example, the solid lines show the temperature of the bake plate 1, and the dotted lines the temperature of the wafer W. It will be appreciated that, according to this embodiment, at the point of time t1 when the wafer W is placed, the temperature of the bake plate 1 falls rapidly because of the heat being taken away by the wafer W and lowering of the atmospheric temperature in the large "transport space" sp1. On the other hand, the wafer W placed on the bake plate 1 undergoes a rapid temperature increase. Then, the temperature rises rapidly from a certain point of time after the "transitional space" sp2 is set at the point of time t2. Subsequently, the "steady space" sp3 is set at the point of time t3, whereby the temperature reaches and stabilizes at the target temperature before heat interference exerts an adverse influence on the temperature control.

The conventional example has only the spaces corresponding to the transport space and transitional space in this invention. It will be seen that a long time is consumed from the setting of the transitional space to attainment of the target temperature, and that temperature control is hindered by heat interference between the bake plate 1 and cover 21.

According to this embodiment, as described above, the CPU 33 adjusts, through the motor 27, the interval between the bake plate 1 and cover 21 to the transport space sp1, transitional space sp2 and steady space sp3 in the stated order. That is, the transport space sp1 is set for loading the wafer W, and the transitional space sp2 is set for the temperature increasing process to increase temperature at a rapid rate. Subsequently, the steady space sp3 is set, thereby preventing an interaction between the temperature controls of the heater 26 and the heating element 3 of the bake plate 1. As a result, the temperature increasing process is reduced in time, and temperature control is stabilized near the target temperature.

This invention is not limited to the foregoing embodiment, but may be modified as follows:

(1) In the foregoing embodiment, the wafer W is placed on the bake plate 1 with the minute space "ms" formed in between. Instead, the wafer W may be placed in direct contact with the bake plate 1.

(2) In the foregoing embodiment, the bake plate 1 is fixed while the cover 21 is movable up and down. Conversely, the bake plate 1 may be moved up and down.

(3) In the foregoing embodiment, the space is adjusted in the three stages of transport stage sp1, transitional space sp2 and steady space sp3. For example, the steady space sp3 may be adapted further adjustable to a plurality of stages.

(4) In the foregoing embodiment, the timer control is carried out according to the recipe for adjustment to each space. Instead, temperature sensors may be provided for the bake plate 1 and cover 21, to make adjustment to each space according to outputs of each sensor. For example, when, after starting heat treatment, an output of each temperature sensor shows a large difference between target temperature and current temperature, an adjustment is made from the transport space sp1 to the transitional space sp2. Then, when the difference is reduced to a predetermined value, an adjustment is made from the transitional space sp2 to the steady space sp3. Since an adjustment is made to each space according to a difference between target value and current value of temperature, a proper adjustment can be made to each space according to circumstances.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate heat treatment apparatus for heat-treating a substrate, comprising:
    a bake plate for supporting the substrate;
    a cover disposed above said bake plate and temperature-controlled for securing a heat-treating atmosphere of said bake plate;
    an adjusting device for adjusting a space between said cover and said bake plate; and
    a control device for adjusting the space, through said adjusting device, successively to a transport space for allowing transport of the substrate, a transitional space smaller than said transport space and close to said bake plate, and a steady space smaller than said transport space and larger than said transitional space;
    wherein said control device is arranged to make adjustments successively to said transitional space and to said steady space after a start of heat treatment according to time intervals based on a predetermined treating procedure.

2. An apparatus as defined in claim 1, wherein said adjusting device includes a motor having a vertical rotary shaft, and a screw shaft interlocked to said rotary shaft and meshed with a mounting bracket attached to said cover.

3. An apparatus as defined in claim 1, wherein said adjusting device includes a motor having a vertical rotary shaft, and a screw shaft interlocked to said rotary shaft and meshed with a mounting bracket attached to said cover.

4. An apparatus as defined in claim 1, wherein said cover has a punching board attached to a lower surface thereof.

5. A substrate heat treatment apparatus for heat-treating a substrate, comprising:
    a bake plate for supporting the substrate;
    a cover disposed above said bake plate and temperature-controlled for securing a heat-treating atmosphere of said bake plate;
    an adjusting device for adjusting a space between said cover and said bake plate; and
    a control device for adjusting the space, through said adjusting device, successively to a transport space for allowing transport of the substrate, a transitional space smaller than said transport space and close to said bake plate, and a steady space smaller than said transport space and larger than said transitional space;
    wherein said control device is arranged to make an adjustment to said transitional space when a large difference exists between a target temperature and a current temperature after a start of heat treatment, and make an adjustment to said steady space when said difference is reduced to a predetermined value.

6. An apparatus as defined in claim 1 or claim 5, wherein said adjusting device provides, as said transitional space, a space between a lower surface of said cover and an upper surface of said substrate preset to be 0.5 to 4 mm.

7. An apparatus as defined in claim 6, wherein said adjusting device provides, as said steady space, a space between the lower surface of said cover and the upper surface of said substrate preset to be 5 to 20 mm.

8. An apparatus as defined in claim 1, or claim 5, wherein said adjusting device provides, as said steady space, a space between a lower surface of said cover and an upper surface of said substrate preset to be 5 to 20 mm.

9. An apparatus as defined in claim 5, wherein said adjusting device includes a motor having a vertical rotary shaft, and a screw shaft interlocked to said rotary shaft and meshed with a mounting bracket attached to said cover.

10. An apparatus as defined in claim 5, wherein said adjusting device includes a motor having a vertical rotary shaft, and a screw shaft interlocked to said rotary shaft and meshed with a mounting bracket attached to said cover.

11. An apparatus as defined in claim 5, wherein said cover has a punching board attached to a lower surface thereof.

\* \* \* \* \*